(12) United States Patent
Kakuda et al.

(10) Patent No.: US 9,939,672 B2
(45) Date of Patent: Apr. 10, 2018

(54) ELECTRONIC DEVICE WITH HEAT SPREADING FILM

(71) Applicant: Apple Inc., Cupertino, CA (US)

(72) Inventors: Tyler R. Kakuda, Stockton, CA (US); Shawn R. Gettemy, San Jose, CA (US); Mark T. Sullivan, Mountain View, CA (US); Ihtesham H. Chowdhury, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 191 days.

(21) Appl. No.: 14/498,814

(22) Filed: Sep. 26, 2014

(65) Prior Publication Data

US 2015/0362791 A1    Dec. 17, 2015

Related U.S. Application Data

(60) Provisional application No. 62/011,850, filed on Jun. 13, 2014.

(51) Int. Cl.
| | |
|---|---|
| *G02F 1/1333* | (2006.01) |
| *G02F 1/1335* | (2006.01) |
| *H01L 23/34* | (2006.01) |
| *H01L 23/40* | (2006.01) |
| *F28F 13/00* | (2006.01) |

(52) U.S. Cl.
CPC .. *G02F 1/133385* (2013.01); *F28F 2013/006* (2013.01); *G02F 1/133308* (2013.01); *G02F 2001/133317* (2013.01); *G02F 2001/133628* (2013.01); *H01L 23/34* (2013.01); *H01L 23/40* (2013.01); *H01L 2023/4068* (2013.01)

(58) Field of Classification Search
CPC .......................................... G02F 2001/133628
See application file for complete search history.

(56) References Cited

U.S. PATENT DOCUMENTS

| | | | |
|---|---|---|---|
| 7,661,866 B2 | 2/2010 | Kaneko et al. | |
| 8,668,364 B2 | 3/2014 | Yu et al. | |
| 8,848,130 B2 | 9/2014 | Mathew et al. | |

(Continued)

FOREIGN PATENT DOCUMENTS

| | | |
|---|---|---|
| CN | 1448766 A | 10/2003 |
| CN | 101604088 A | 12/2009 |

(Continued)

*Primary Examiner* — Jessica M Merlin
*Assistant Examiner* — Mark Teets
(74) *Attorney, Agent, or Firm* — Treyz Law Group, P.C.; G. Victor Treyz; Joseph F. Guihan

(57) ABSTRACT

An electronic device may have a housing in which components are mounted that produce heat. The heat producing components may be light-emitting diodes mounted on a flexible printed circuit in a display backlight, may be integrated circuits, or may be other devices that generate heat during operation. A heat spreading layer such as a layer of graphite may be attached to the backlight unit or other structures in the electronic device using adhesive. The adhesive may be patterned to form an unbonded area between at least some of the backlight unit or other structures to which the heat spreading layer is being attached and the heat spreading layer. The heat spreading layer may be mounted adjacent to a housing structure such as a metal midplate member that is attached to housing walls in the housing.

20 Claims, 14 Drawing Sheets

(56) References Cited

U.S. PATENT DOCUMENTS

| | | |
|---|---|---|
| 2004/0004424 A1 | 1/2004 | Sakurai |
| 2004/0226693 A1* | 11/2004 | Iwasaki ............... F28F 9/0226 165/81 |
| 2006/0292461 A1* | 12/2006 | Shives ............. G02F 1/133385 430/7 |
| 2007/0159078 A1* | 7/2007 | Park ..................... H01L 51/529 313/504 |
| 2009/0231264 A1* | 9/2009 | Hatakeyama ........ G02B 6/0091 345/102 |
| 2009/0303409 A1* | 12/2009 | Park ................. G02F 1/133308 349/58 |
| 2011/0149602 A1* | 6/2011 | Lee ..................... G02B 6/0091 362/612 |
| 2012/0002438 A1 | 1/2012 | Gourlay |
| 2012/0086882 A1 | 4/2012 | Itoh |
| 2012/0229726 A1* | 9/2012 | Kim ..................... G02F 1/1336 349/58 |
| 2012/0257107 A1 | 10/2012 | Itoh |
| 2013/0094245 A1 | 4/2013 | Kanda et al. |
| 2013/0162506 A1 | 6/2013 | Kim et al. |
| 2013/0322121 A1 | 12/2013 | Yang |
| 2014/0125922 A1* | 5/2014 | Terashima ........... G02B 6/0011 349/65 |
| 2015/0049255 A1* | 2/2015 | Terashima ........... G02B 6/0085 348/790 |

FOREIGN PATENT DOCUMENTS

| | | |
|---|---|---|
| CN | 102341734 A | 2/2012 |
| CN | 103003620 | 3/2013 |
| CN | 204925558 U | 12/2015 |
| JP | 2004006193 | 1/2004 |
| JP | 2007212762 | 8/2007 |
| JP | 201086767 | 4/2010 |
| JP | 2010224000 | 10/2010 |
| JP | 2011-113904 | 6/2011 |
| JP | 2011243554 | 12/2011 |
| JP | 2012519931 | 8/2012 |
| KR | 10-2007-0001544 | 1/2004 |
| TW | M354974 | 4/2009 |
| TW | M437472 | 9/2012 |
| WO | 2011080954 | 7/2011 |
| WO | 2012169406 | 12/2012 |

* cited by examiner

ELECTRONIC DEVICE WITH HEAT SPREADING FILM

This application claims the benefit of provisional patent application No. 62/011,850, filed Jun. 13, 2014, which is hereby incorporated by reference herein in its entirety.

BACKGROUND

This relates generally to electronic devices, and more particularly, to electronic devices with components that generate heat.

Electronic devices often include components that generate heat. For example, a display may have a backlight unit that provides backlight illumination. The backlight unit may have a light guide plate that distributes backlight from a row of light-emitting diodes. The light-emitting diodes and other electrical components in a device may generate waste heat. Heat can be dissipated through portions of a device housing, such as metal housing structures. If care is not taken, however, hotspots can develop due to concentrations of heat-producing components. To minimize the formation of thermal hotspots when the light-emitting diodes in a backlight unit are used, control circuitry may restrict the amount of light produced by the light-emitting diodes whenever the temperature rise associated with use of the light-emitting diodes has become too large. This can result in undesirably dim output levels from the backlight unit, making images on the display difficult to view in bright ambient lighting conditions.

It would therefore be desirable to be able to provide improved arrangements for managing heat in electronic devices such as devices with displays.

SUMMARY

An electronic device may have a housing in which components are mounted that produce heat. The heat-producing components may be light-emitting diodes mounted on a flexible printed circuit in a display backlight, may be integrated circuits, or may be other devices that generate heat during operation. A heat spreading layer such as a layer of graphite, copper, or other material with an elevated thermal conductivity level, may be attached to the backlight unit or other structures in the electronic device. The light-emitting diodes or other heat generating components may overlap the heat spreading layer. During operation, heat that is produced by the heat generating components may be spread laterally thorough the heat spreading layer, which helps dissipate heat efficiently.

Adhesive may be used in attaching the heat spreading layer to the backlight unit. The adhesive that is used in attaching the heat spreading layer to the backlight unit may be patterned to ensure that at least some portion of the heat spreading layer is not bonded to the backlight unit and can therefore move relative to the backlight unit to accommodate expansion and contraction of the heat spreading layer and other display layers during operation of the backlight unit.

The heat spreading layer may be mounted adjacent to a housing structure such as a metal midplate member that is attached to housing walls in the housing of the electronic device. Heat may flow between the heat spreading layer and the metal midplate member across an air gap. In some configurations, the heat spreading layer may expand against the metal midplate member during operation acting as a thermal "switch."

The layers of material in the heat spreading layer may be sufficiently flexible to bend with other flexible layers in an electronic device. As an example, the heat spreading layer may be attached to a flexible structure such as a flexible printed circuit or a flexible organic light-emitting diode display. The adhesive that is used to attaching the heat spreading layer to the flexible structure may be formed only along the edges of the structure or may be arranged in other patterns that ensure that there are at least some unbonded regions between portions of the flexible structure and the heat spreading layer. The presence of the unbounded regions helps accommodate bending of the flexible structure during operation.

DETAILED DESCRIPTION

Electronic devices may include components that produce heat. For example, an electronic device may have a display with a backlight unit. The backlight unit may have light-emitting diodes that produce backlight illumination for the display. The light-emitting diodes produce heat during operation. Integrated circuits and other components in an electronic device may also produce heat. To avoid excessive concentrations of heat (hotspots), an electronic device may be provided with a heat spreading layer. The heat spreading layer may be formed from a layer of graphite, carbon nanotubes, copper, and/or other layers of material with high thermal conductivity values. The heat spreading layer distributes heat so that excessive concentrations of heat within the electronic device are avoided.

The heat spreading layer may be attached to the backlight unit of a display. To prevent undesired wrinkling of layers in the display such as a reflector layer in the backlight unit, the heat spreading layer may be attached to the backlight unit using a C-shaped strip of adhesive or adhesive that has been patterned using other sparse patterns. With this type of arrangement, the adhesive bonds some of the heat spreading layer to the backlight unit, but is absent in other areas. The areas in the heat spreading layer in which the adhesive is absent remain unbonded to the backlight unit and can therefore shift in position to accommodate expansion and contraction during thermal cycling without disrupting satisfactory operation of the backlight unit.

Illustrative electronic devices that may be provided with displays and other structures that include heat spreading layers for spreading heat produced by light-emitting diodes and other heat generating components are shown in FIGS. 1, 2, 3, and 4.

Figure 1:
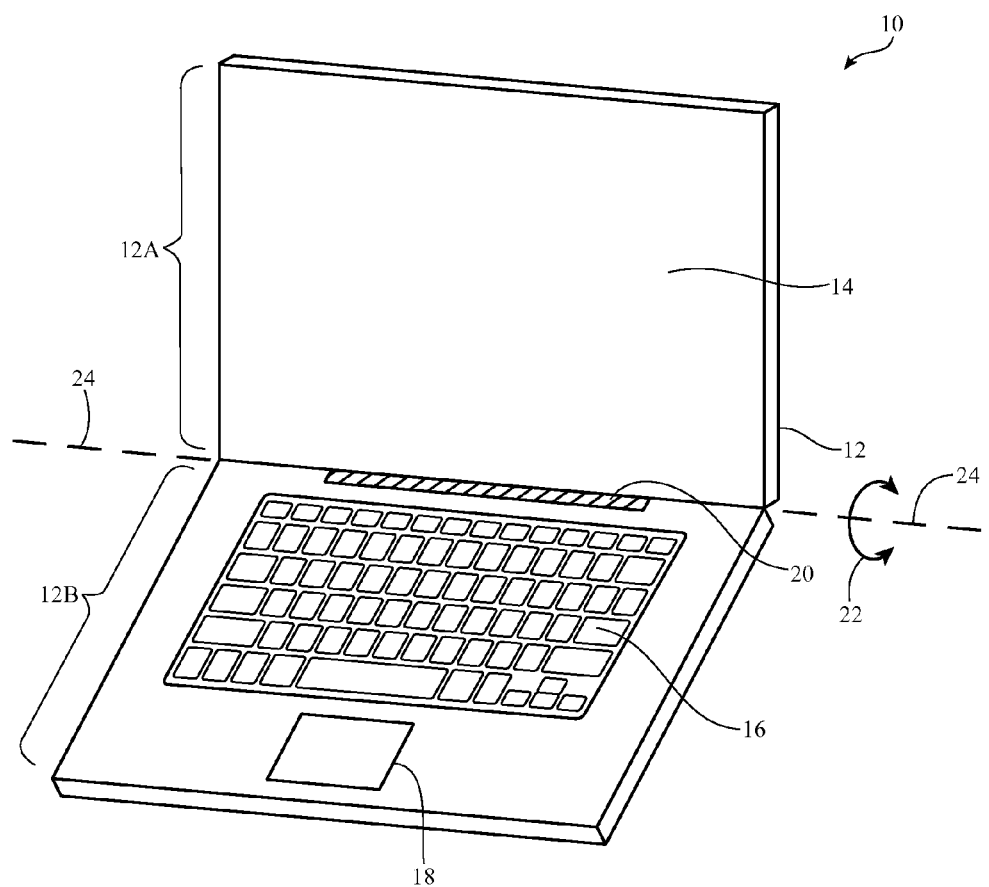
FIG. 1 is a perspective view of an illustrative electronic device such as a laptop computer with a display in accordance with an embodiment.

Illustrative electronic device 10 of FIG. 1 has the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
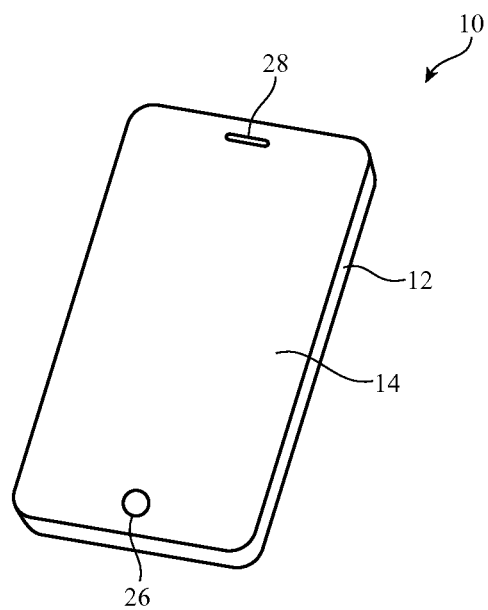
FIG. 2 is a perspective view of an illustrative electronic device such as a handheld electronic device with a display in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
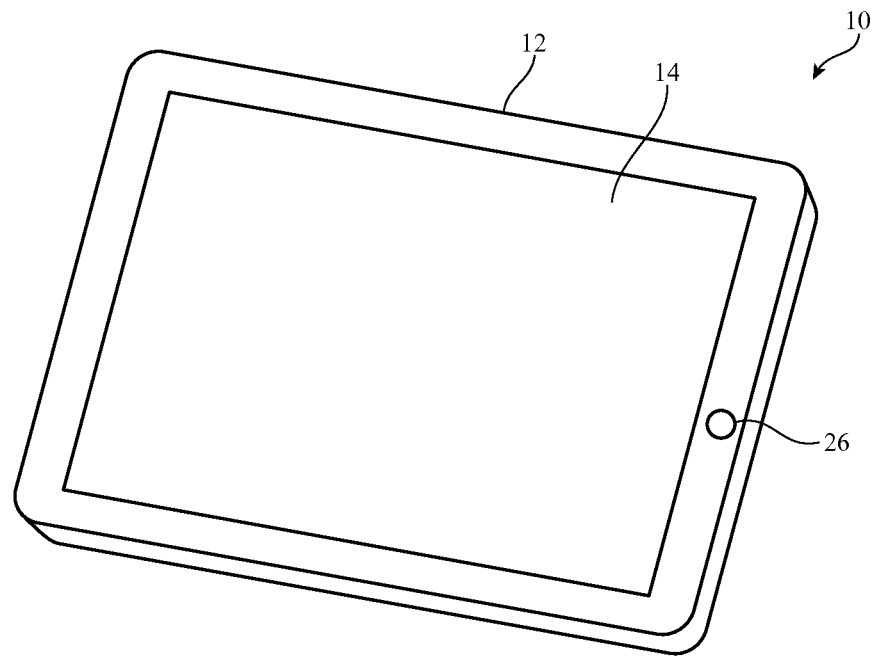
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
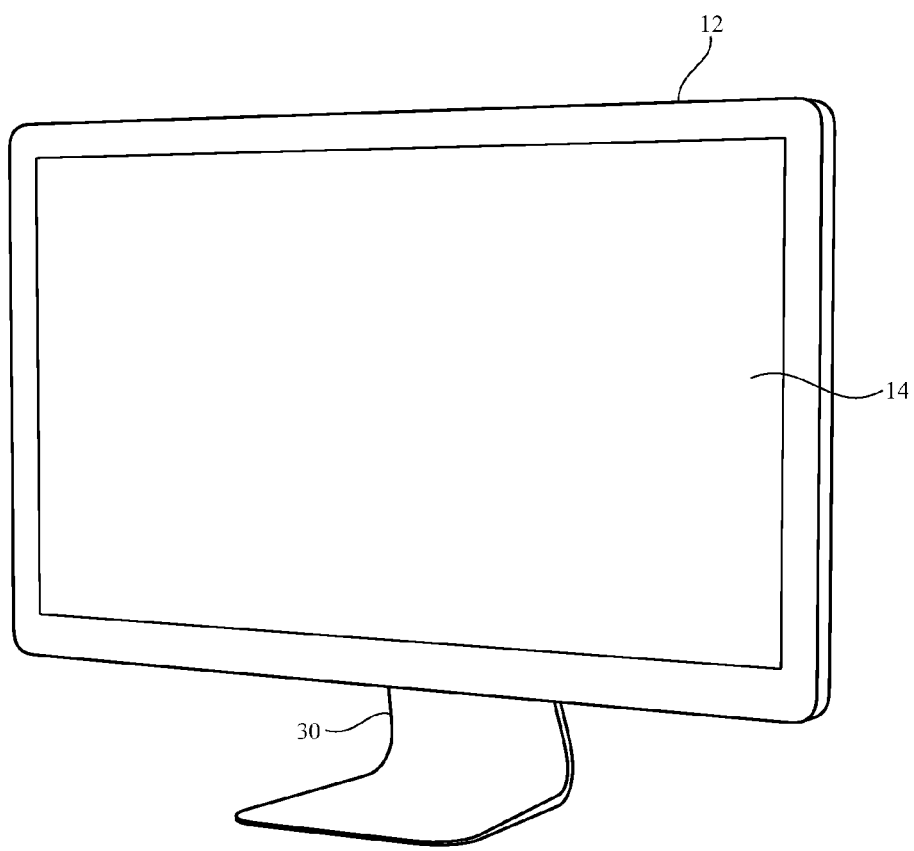
FIG. 4 is a perspective view of an illustrative electronic device such as a computer display with display structures in accordance with an embodiment.

FIG. 4 shows how electronic device 10 may be a computer display, a computer that has been integrated into a computer display, or a display for other electronic equipment. With this type of arrangement, housing 12 for device 10 may be mounted on a support structure such as stand 30 or stand 30 may be omitted (e.g., stand 30 can be omitted when mounting device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements, metal midplate members, or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 may include display pixels formed from liquid crystal display (LCD) components or other suitable image pixel structures.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass substrate, a clear plastic layer, or other transparent substrate member.

Figure 5:
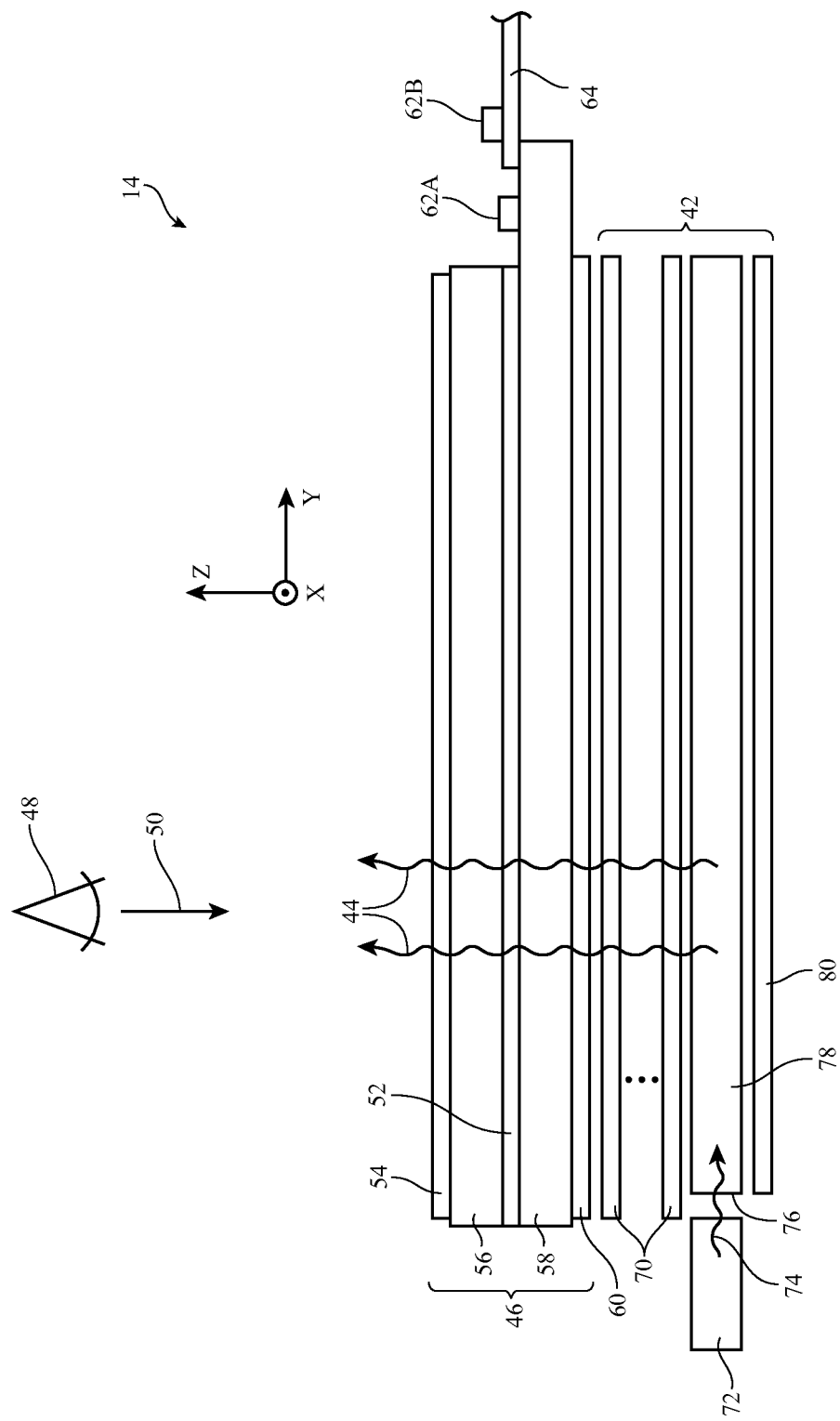
FIG. 5 is a cross-sectional side view of an illustrative display in accordance with an embodiment.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such as liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, lower layer 58 may be a color filter layer and upper layer 56 may be a thin-film transistor layer. Another illustrative configuration involves forming color filter elements and thin-film transistor circuits with associated pixel electrodes on a common substrate. This common substrate may be the upper substrate or may be the lower substrate and may be used in conjunction with an opposing glass or plastic layer (e.g., a layer with or without any color filter elements, thin-film transistors, etc.) to contain liquid crystal layer 52.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes. If desired, light sources such as light source 72 may be located along multiple edges of light guide plate 78.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by a reflective film such as reflector 80. Reflector 80 may be formed from a reflective material such as a reflective polymer layer, a metalized layer, a layer of white plastic, or other reflective materials. Reflector 80 may, as an example, have multiple dielectric layers with alternating high and low index of refraction values that form a dielectric stack that efficiently reflects light 74.

To enhance backlight performance for backlight structures 42, backlight structures 42 may include optical films 70. Optical films 70 may include one or more diffuser layers for helping to homogenize backlight 44 and thereby reduce undesired concentrations of backlight and one or more prism films (also sometimes referred to as turning films or brightness enhancement films) for collimating backlight 44. Compensation films for enhancing off-axis viewing may be included in optical films 70 or may be incorporated into other portions of display 14 (e.g., compensation films may be incorporated into one or more polarizer layers). Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
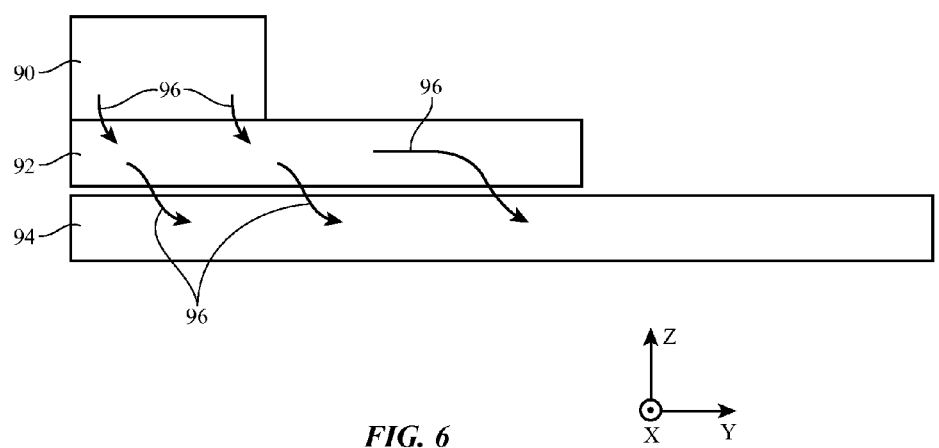
FIG. 6 is a cross-sectional side view of an illustrative heat producing component and an associated heat spreading structure in accordance with an embodiment.

During operation of device 10, integrated circuits, light-emitting diodes, and other components produce heat. A heat spreading layer may spread the heat within device 10 to avoid creating thermal hotspots. An illustrative configuration in which heat is being spread using a heat spreading layer is shown in FIG. 6. FIG. 6 is a cross-sectional side view of illustrative device structures in device 10. Component 90 is an electrical component that produces heat. Component 90 may, for example, include an integrated circuit or a light-emitting diode (as examples). Heat spreading layer 92 may spread heat 96 that is emitted from component 90. In the example of FIG. 6, heat spreading layer 92 lies in the X-Y plane and spreads heat 96 laterally in dimensions X and Y. Heat 96 also flows vertically (in the −Z direction of FIG. 6). In particular, heat 96 that has passed from component 90 to heat spreading layer 92 and that has been laterally distributed using heat spreading layer 92 may pass to structure 94. Structure 94 may be a metal structure or other structure that helps to dissipate heat 96. Structure 94 may be, for example, a metal layer such as a metal housing midplate (e.g., a stainless steel sheet metal layer or other planar housing member in device 10). A housing midplate may be located in the middle of device housing 12. The midplate (i.e., structure 94) may, as an example, span the interior of device 10 between opposing housing edges in housing 12. The midplate may be welded or otherwise attached to housing 12 around the periphery of housing 12.

In the absence of heat spreading layer 92, heat 96 may remain concentrated in the vicinity of component 90, creating an undesired thermal hotspot on device 12. When heat spreading layer 92 is present in a location of the type shown in FIG. 6, heat 96 from component 90 spreads outwardly in dimensions X and Y within layer 92. Heat 96 can then be transferred to structure 94, which serves as a heat sink and helps further dissipate the heat. The enlarged surface area between heat spreader 92 and structure 94 that results from using heat spreader 92 to laterally spread heat 96 may help to improve heat dissipation efficiency. Heat spreader 92 may contact structure 94 at one or more locations or may be separated from structure 94 by an air gap. The air gap may serve as a buffer that allows the layers of a display or other structures in device 10 to be assembled without unnecessary risk of consuming more vertical space than is available within device (i.e., the air gap may serve to satisfy vertical alignment tolerance requirements).

Heat spreading layer 92 may be formed from any suitable material that has a high thermal conductivity and can therefore serve to spread heat 96. Examples of materials that may be used for forming heat spreading layer 92 include metal (e.g., copper, other metals, or combinations of copper and other metals), carbon nanotubes, graphite, or other materials that exhibit high thermal conductivity. If desired, heat spreading layer 92 may be formed from two or more thermally conductive layers of different types (e.g., a layer of copper attached to a layer of graphite, etc.). Polymer carrier films may also be incorporated in layer 92 (e.g., to support a layer of graphite).

Figure 7:
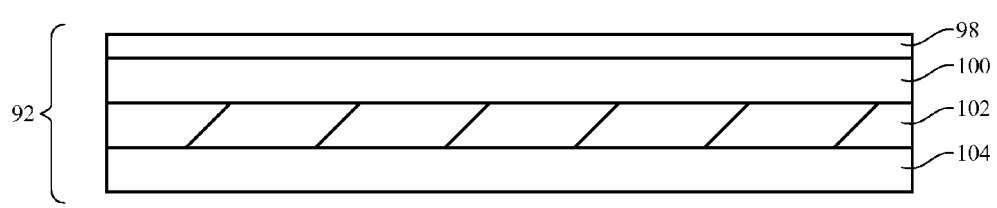
FIG. 7 is a cross-sectional side view of a heat spreading layer in accordance with an embodiment.

In the example of FIG. 7, heat spreading layer 92 is a graphite heat spreading layer having a graphite layer such as graphite layer 102 interposed between upper and lower polymer carrier layers 100 and 104. An adhesive layer such as adhesive layer 98 may be applied to upper polymer layer 100 (as an example). Adhesive 98 may be pressure sensitive adhesive, liquid adhesive, adhesive that is cured by application of light (e.g., ultraviolet-light-cured adhesive), may be temperature sensitive adhesive, may be other types of adhesive, or may include two or more of these types of adhesive. If desired, one of layers 100 and 104 may be omitted (e.g., layer 100 may be omitted). Graphite layer 102 may have a thickness of 5-20 microns, more than 10 microns, less than 30 microns, or other suitable thickness. Polymer layers 100 and 104 may be formed from sheets of flexible material such as polyethylene terephthalate or other polymer material.

Figure 8:
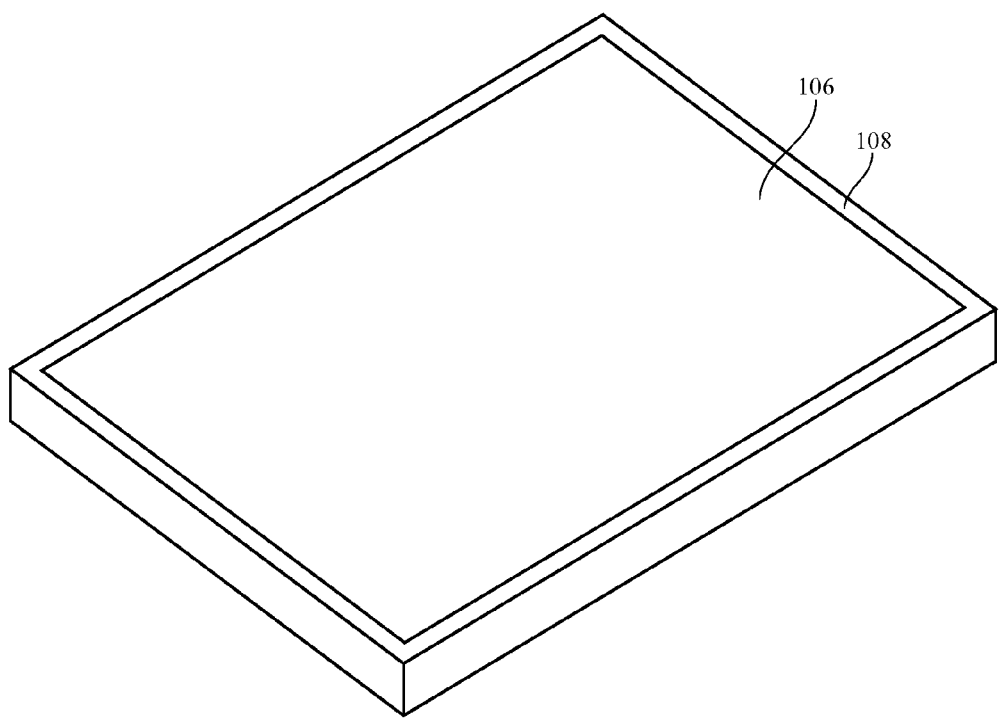
FIG. 8 is a perspective view of an illustrative backlight unit in accordance with an embodiment.

FIG. 8 is a perspective view of an illustrative backlight unit for device 10. Backlight unit 42 may have backlight layers 106 (e.g., optical films 70, light guide plate 78, reflector 80, etc.) in chassis 108. Chassis 108 may be a plastic frame, a plastic frame molded over a metal frame, a metal frame, or other support structure. Backlight layers 106 and light-emitting diodes 72 may be assembled in chassis 108 to form backlight unit 42. Display 14 may be formed by mounting backlight unit 42 under display layers 46, as described in connection with FIG. 5.

Figure 9:
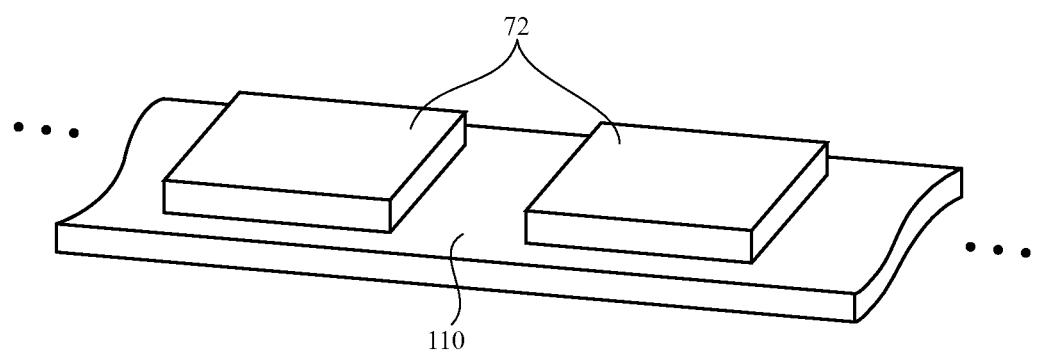
FIG. 9 is a perspective view of an illustrative flexible printed circuit that has been populated with components such as light-emitting diodes in accordance with an embodiment.

As shown in the perspective view of FIG. 9, light-emitting diodes 72 may be mounted in a row (e.g., a linear array) on a substrate such as substrate 110. Substrate 110 may be a plastic carrier, a printed circuit, or other suitable substrate structure. As an example, substrate 110 may be a printed circuit (e.g., a rigid printed circuit formed from a rigid printed circuit board material such as fiberglass-filled epoxy or a flexible printed circuit formed from a flexible printed circuit material such as a sheet of polyimide or other flexible polymer layer). The row of light-emitting diodes 72 may be mounted along one of the edges of light guide plate 78. If desired, arrays of light-emitting diodes 72 may be formed along multiple edges of light guide plate 78 (e.g., opposing upper and lower edges, opposing right and left edges, etc.).

Figure 10:
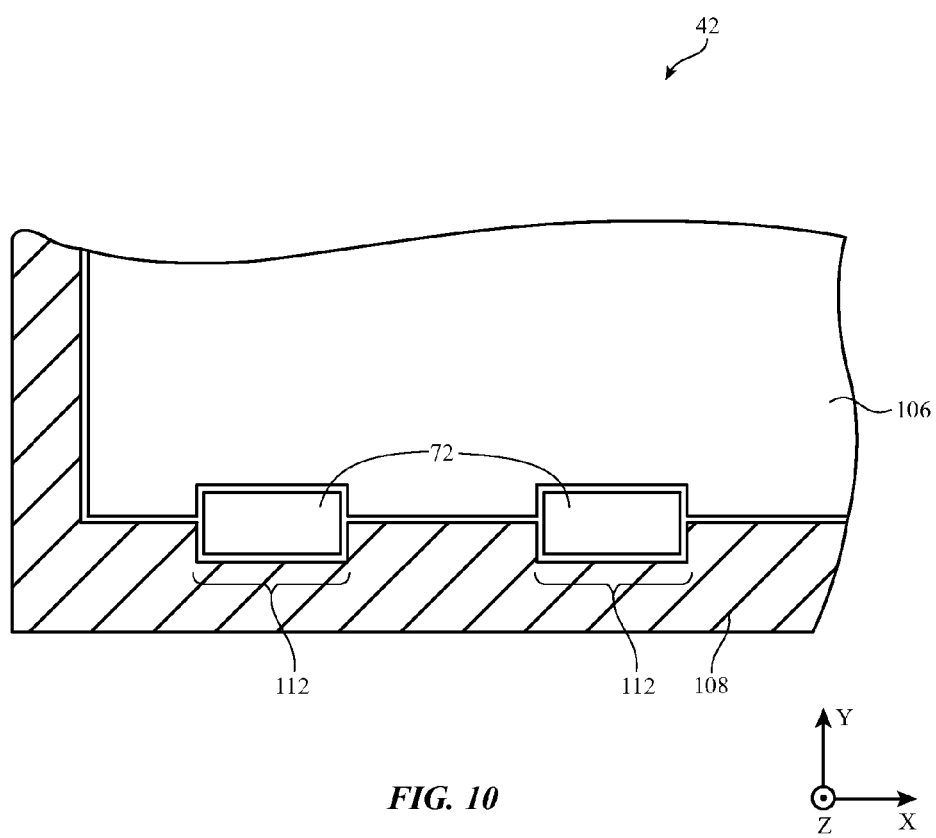
FIG. 10 is a top view of an end portion of a backlight unit having an array of light-emitting diodes in accordance with an embodiment.

FIG. 10 is a top view of a portion of an illustrative backlight unit showing how chassis 108 may have notches such as notches 112 to accommodate light-emitting diodes 72. Configurations for display 14 in which backlight unit 42 does not have notches 112 in chassis 108 may also be used.

In some situations, it may be desirable to prevent heat spreading layer 92 from being too widely and firmly attached to other structures in display backlight unit 42, as mismatch in the coefficients of thermal expansion between the heat spreading layer and the structures to which the heat spreading layer is attached may lead to undesired artifacts (e.g., wrinkles in flexible layers). This concern can be addressed by attaching heat spreading layer 92 to structures in backlight unit 42 using adhesive that covers only a portion of heat spreading layer 92, so that a portion of heat spreading layer 92 remains unbonded to backlight unit 42 by adhesive.

Figure 11:
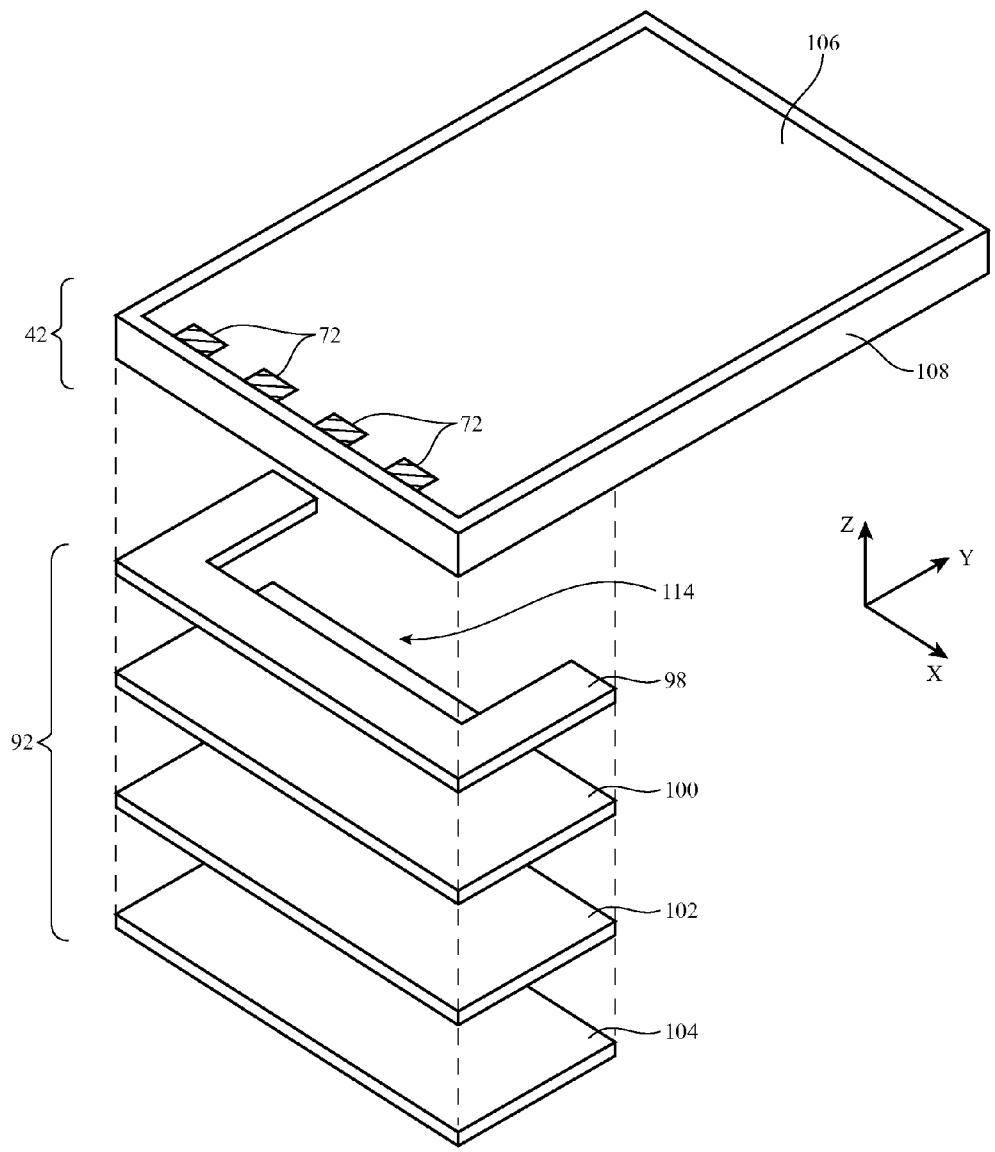
FIG. 11 is an exploded perspective view of an illustrative backlight unit and an associated heat spreading layer in accordance with an embodiment.

As an example, consider the scenario of FIG. 11. FIG. 11 is an exploded perspective view of backlight unit 42 and associated layers within heat spreading layer 92. As shown in FIG. 11, heat spreading layer 92 may include layers such as graphite layer 102 (or other heat spreading material or layers of multiple materials). Layer 102 may be supported by one or more supporting layers such as polymer layers 100 and 104. Adhesive layer 98 may be used to attach heat spreading layer 92 to the underside of backlight unit 42. During operation, light-emitting diodes 72 produce light 74 for backlight 44. As a byproduct of the process of producing light 74, light-emitting diodes 72 also produce heat. The heat is spread laterally in dimensions X and Y through heat spreading layer 92. To facilitate the transfer of heat from light-emitting diodes 72 to heat spreading layer 92, heat spreading layer 92 preferably overlaps light-emitting diodes 72 (i.e., light-emitting diodes 72 are located at lateral positions in dimensions X and Y that overlap underlying heat-spreading layer 92).

The heat that is produced by light-emitting diodes 72 causes the structures of FIG. 11 to rise in temperature. Due to mismatches in the coefficients of thermal expansion for the structures of FIG. 11, the rise in temperature of layers 92 can give rise for a potential for one or more of the structures of FIG. 11 to buckle. For example, one or more of layers 106 (e.g., reflector 80 on the lower surface of backlight unit 42) may wrinkle due to mismatches between the lateral expansion of the reflector or other layers in backlight unit 42 relative to the lateral expansion of heat spreading layer 92. The tendency of rises in temperature to cause wrinkles can be minimized by configuring adhesive 98 to reduce the extent of the attachment between heat spreading layer 92 and backlight unit 42. With one suitable arrangement, the thickness of adhesive layer 98 may be increased and/or the adhesive layer 98 may be formed using an adhesive material with an enhanced softness to give layer 98 an ability to shear slightly when transverse loads are applied during heating. With another suitable arrangement, which is illustrated in FIG. 11, adhesive 98 may cover only part of the surface area of heat spreading layer 92 (e.g., layers 100, 102, and 104). In the FIG. 11 example, adhesive 98 has been formed in a C-shaped strip that runs along the edges of backlight unit 42. Adhesive 98 may overlap light-emitting diodes 72 and may attach heat spreading layer 92 to reflective layer 80 (on the bottom layer of backlight unit 42) or other portions of backlight unit 42 (e.g., chassis 108). Central opening 114 is formed in adhesive 98, so that the portion of heat spreading layer 92 in area 114 is unbonded to backlight unit 42. Opening 114 may extend across most of the width of display backlight unit 42 in dimension X (as an example). The C-shape of the strip of adhesive forming adhesive 98 allows adhesive 98 to surround unbonded area 114 on three sides (i.e., the strip of adhesive 98 in FIG. 11 runs along three edges of opening 114). Due to the presence of unbonded region 114, adhesive 98 is weakly attached to heat spreading layer 92, thereby accommodating expansion and contraction of display structures during heating and cooling that results from use of light-emitting diodes 72.

Figure 12:
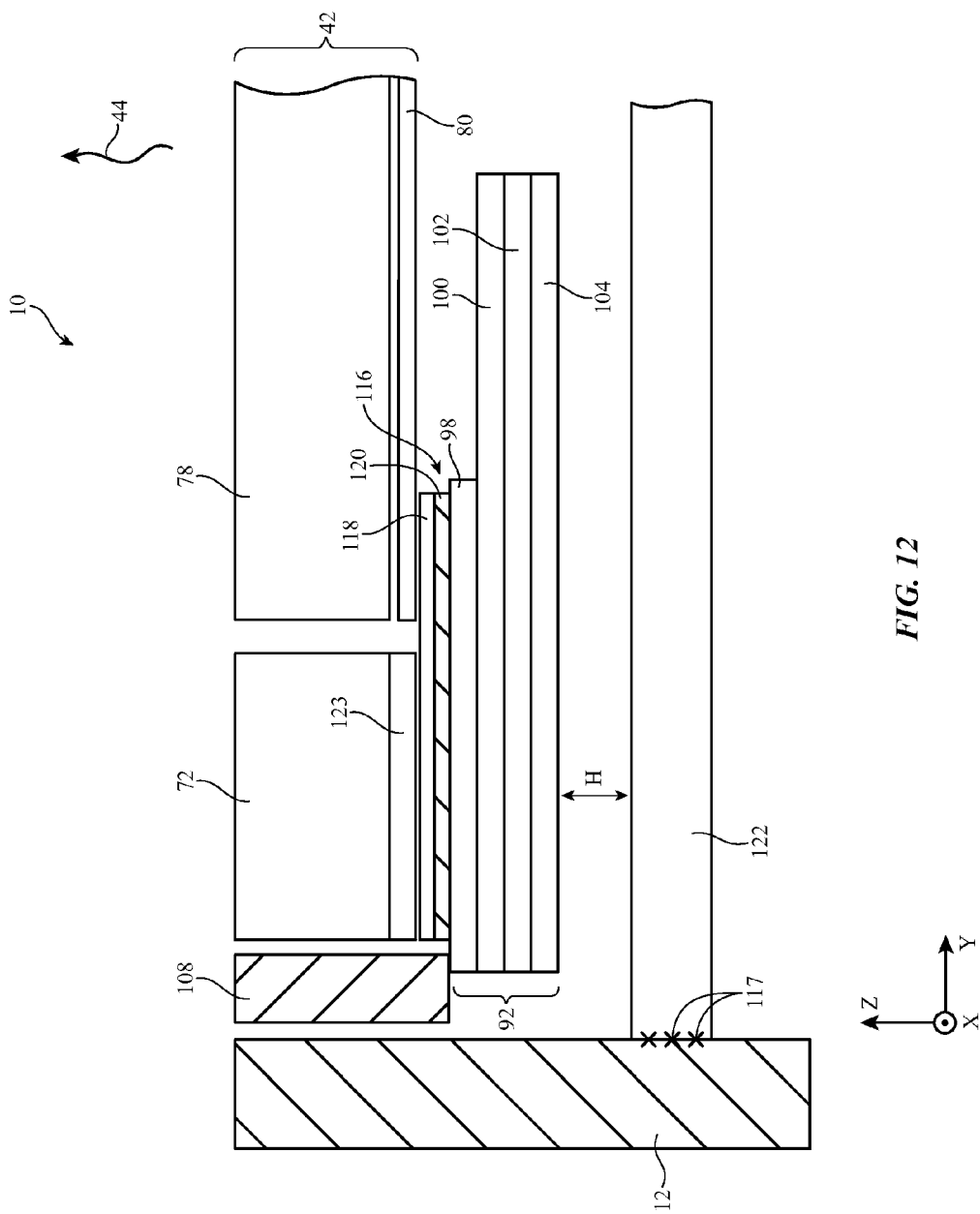
FIG. 12 is a cross-sectional side view of a portion of a display in which a heat spreading layer is being used to spread heat away from a light-emitting diode in accordance with an embodiment.

FIG. 12 is a cross-sectional side view of a portion of display backlight 42 and heat spreading layer 92 of FIG. 11 mounted in device housing 12. As shown in FIG. 12, device 10 may have a housing with an outer sidewall (wall 12) and an internal housing member such as midplate 122. Housing wall 12 may be formed from aluminum, stainless steel, other metals, plastic, or other materials. Midplate 122 may be formed from metal and/or plastic molded over sheet metal parts (as an example). For example, midplate 122 may be formed from stainless steel or other metal that is attached to housing wall 12. Welds 117 or other attachment mechanisms may be used in mounting midplate 122 to housing 12. Midplate 122 may be formed from one or more sheet metal members that span housing 12 and can help provide device 10 with structural rigidity. If desired, midplate 122 can be omitted and a rear wall portion of housing 12 or other device structures can be used to provide device 10 with structural rigidity. The use of midplate 122 in device 10 is merely illustrative.

Light-emitting diodes 72 may be mounted on a printed circuit such as printed circuit 123. Printed circuit 123 may be, for example, a flexible printed circuit. Reflector 80 may be used to reflect light that is traveling in light guide plate 78 upwards in direction Z to serve as backlight illumination 44 for display 14.

To reduce stray light, a light blocking structure such as black tape 116 or other light blocking tape may be attached to backlight unit 42 under light-emitting diodes 42. Black tape 116 may include a layer of adhesive such as pressure sensitive adhesive 118 (or liquid adhesive, temperature-sensitive adhesive, etc.) and a layer of opaque material such as black plastic layer 120. As shown in FIG. 12, light-blocking tape 116 may overlap light-emitting diodes 72 (and flexible printed circuit 123) and an adjoining portion of reflector 80.

Heat spreading layer 92 may be attached to display 14 by using adhesive 98 to attach one or more regions of layer 92 to the lower surface of backlight unit 42. With the illustrative configuration of FIG. 12, adhesive 98 attaches heat spreading layers 100, 102, and 104 of heat spreading layer 92 to the lower surface of black tape 116. Heat is produced while using light-emitting diodes 72 to produce backlight. The heat is spread laterally in dimensions X and Y by heat spreading layer 92. Heat spreading layer 92 may be separated (at least initially) from midplate 122 by an air gap H. Because heat from light-emitting diodes 72 is spread laterally over a relatively large area (i.e., the entire area of heat spreading layer 92), the heat can efficiently travel downwards across any air gap H that lies between heat spreading layer 92 and midplate 122 into midplate 122. Once the heat has reached midplate 122, midplate 122 can dissipate the heat through other device structures and/or the surrounding environment of device 10 (e.g., heat can pass from midplate 122 to the walls of housing 12 and other portions of device10 and can pass from housing 12 and the other portions of device 10 to the air surrounding device 10).

Tape 116 is attached to backlight unit structures such as chassis 108, flexible printed circuit 123, and reflector 80 and therefore forms part of backlight unit 42. Adhesive 98 preferably attaches heat spreading layer 92 to backlight unit 42 using an arrangement for adhesive 98 that accommodates thermal expansion and contraction without causing undesired wrinkles in reflector 80 or other structures of backlight unit 42 (e.g., flexible printed circuit 123). Illustrative configurations for adhesive 98 are shown in FIGS. 13, 14, 15, 16, 17, and 18.

Figure 13:
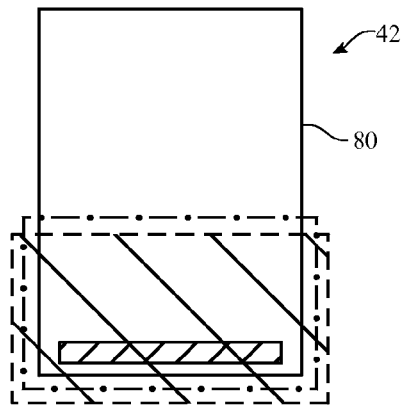
FIG. 13 is a top view of an illustrative configuration for a display in which a heat spreading layer is attached to a reflector or other layer in the display using a rectangular patch of adhesive in accordance with an embodiment.

In the configuration of FIG. 13, adhesive 98 has a blanket rectangular shape that covers substantially all of heat spreading layer 92. In this type of configuration (and, if desired, in the configurations of FIGS. 14, 15, 16, 17, and 18), adhesive 98 may be formed using a layer of material that is relatively thick and/or soft. With this approach, adhesive 98 is loosely attached to backlight unit 42 so that when shearing forces are generated due to thermal expansion, the adhesive bond between backlight unit 42 and heat spreading layer can give somewhat to accommodate the shearing forces and resulting lateral movement between adjacent layers.

Figure 14:
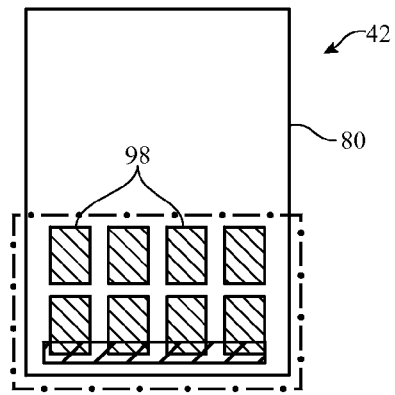
FIG. 14 is a top view of an illustrative configuration for a display in which a heat spreading layer is attached to a reflector or other layer in the display using an array of rectangular adhesive patches in accordance with an embodiment.
Figure 15:
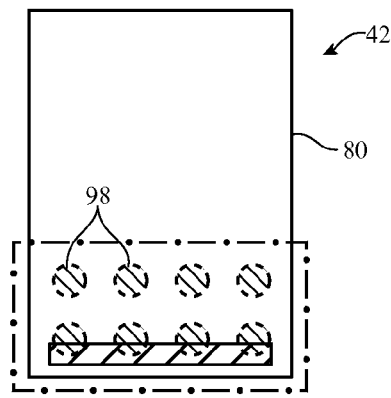
FIG. 15 is a top view of an illustrative configuration for a display in which a heat spreading layer is attached to a reflector or other layer in the display using an array of circular adhesive patches in accordance with an embodiment.
Figure 16:
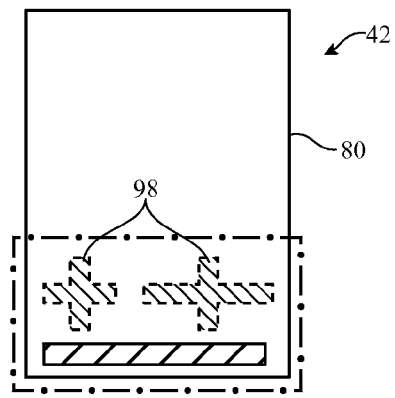
FIG. 16 is a top view of an illustrative configuration for a display in which a heat spreading layer is attached to a reflector or other layer in the display using cross-shaped adhesive areas in accordance with an embodiment.
Figure 17:
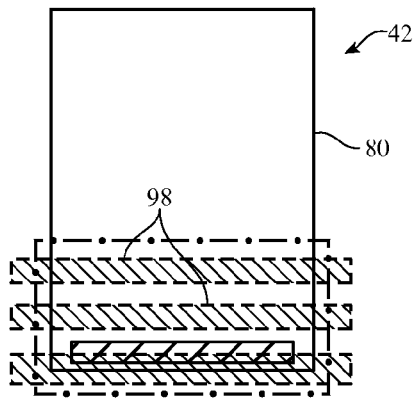
FIG. 17 is a top view of an illustrative configuration for a display in which a heat spreading layer is attached to a reflector or other layer in the display using elongated strips of adhesive in accordance with an embodiment.
Figure 18:
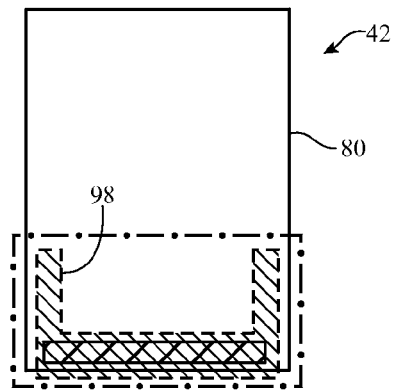
FIG. 18 is a top view of an illustrative configuration for a display in which a heat spreading layer is attached to a reflector or other layer in the display using a C-shaped strip of adhesive that runs along the peripheral edges of a backlight unit in accordance with an embodiment.

In the illustrative configuration of FIG. 14, adhesive 98 is provided in an array of rectangular areas, so that portions of heat spreading layer 92 remain unbonded to backlight unit 42. An array of adhesive 98 having circular or oval shapes is used in the illustrative configuration of FIG. 15. If desired, adhesive patches such as the rectangular pads of adhesive of FIG. 14 and/or adhesive pads having curved edges such as the pads of adhesive of FIG. 15 or other isolated regions of adhesive may be provided in non-uniform arrays (e.g., distributed in a pseudo random pattern or a pattern that includes regions of adhesive that are not all in regular rows and columns). FIG. 16 shows how regions of adhesive 98 may be provided using cross shapes. The cross-shapes may be symmetrical (e.g., with branches that are all of the same length) or asymmetrical (e.g., having branches of uneven lengths). In the FIG. 17 example, adhesive 98 has been provided in strips that run along dimension X. Adhesive 98 may also be provide in strip-shaped regions that run diagonally, that run in dimension Y, using zigzag patterns, or using any other suitable shapes. In the example of FIG. 18, adhesive 98 has been provided in a C-shaped strip that runs along all of one edge of backlight 42 and parts of two other edges of backlight 42. Configurations in which adhesive 98 has been patterned to form other shapes (e.g., other shapes that form an unbonded region between layer 92 and structures 42) may be used if desired. The examples of FIGS. 13, 14, 15, 16, 17, and 18 are merely illustrative.

Figure 19:
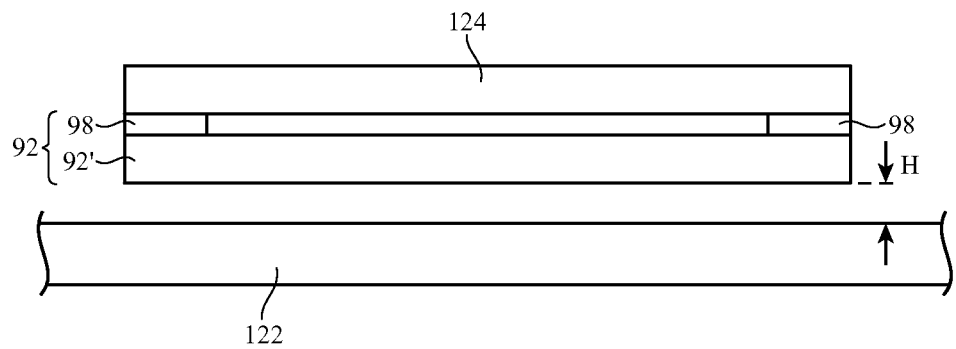
FIG. 19 is a cross-sectional side view of a device structure such as a display layer or other flexible layer to which a heat spreading layer has been attached in accordance with an embodiment.
Figure 20:
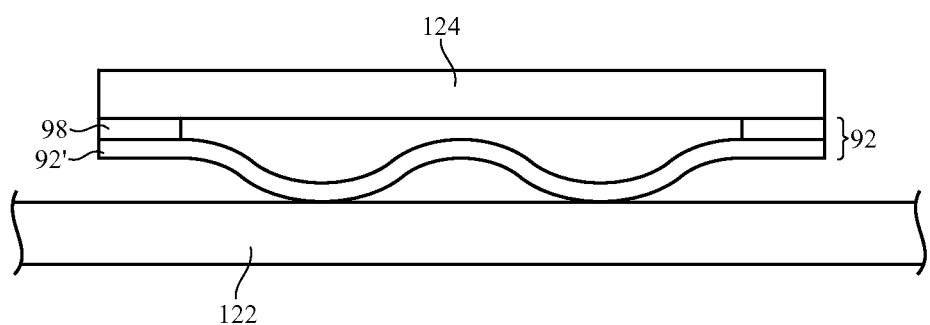
FIG. 20 is a cross-sectional side view of the device structure of FIG. 19 during operation at an elevated temperature that has caused the heat spreading layer to expand and buckle in an unbonded (adhesive-free) region in accordance with an embodiment.
Figure 21:
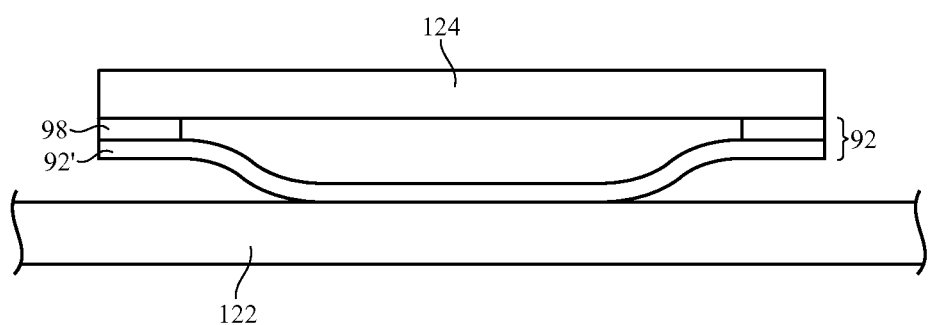
FIG. 21 is a cross-sectional side view of the device structure of FIG. 20 following additional heating that has caused the heat spreading layer to expand sufficiently press against a housing structure or other heat sinking structure in accordance with an embodiment.

FIGS. 19, 20, and 21 show how heat spreading layer 92 may move into contact with device structures such as midplate 122 to accommodate thermal expansion during operation of device 10. As shown in FIG. 19, before heat is produced by light-emitting diodes or other components in device 10, heat spreading layer 92 may have a relatively flat configuration (as an example). Heat spreading layer 92 may include heat spreading sheet 92' (e.g., layers such as layers 100, 102, and 104) and adhesive 98. Adhesive 98 may be formed at opposing ends of heat spreading layer 92 and may attach heat spreading layer 92 to structure 124 while leaving an unbonded region in the center of layer 92 (as an example). Structure 124 may be a structure such as backlight unit 42 (e.g., a reflector, black tape coupled to an array of light-emitting diodes on a flexible printed circuit, a light guide plate, etc.), a flexible printed circuit, a housing structure, or other component or structure associated with device 10. An air gap H may separate heat spreading layer 92 from midplate 122 or other structure in device 10. Air gap H may be used to ensure that alignment tolerance requirements are satisfied (e.g., vertical tolerances).

Following heating of layer 92' (e.g., due to heat from light-emitting diodes, integrated circuits, or other heat generating components), layer 92' may expand and buckle until portions of layer 92' contact midplate 122, as shown in FIG. 20. In the configuration of FIG. 20, additional heat may be transferred from heat spreading layer 92 to midplate 122, because direct contact between layer 92' and midplate 122 creates a more efficient heat transfer path than air gap H.

Following additional heating (e.g., after heating layer 92' of FIG. 20 to an elevated temperature), layer 92' may expand sufficiently to spread downwardly into contact with an enlarged area on the upper surface of midplate 122, as shown in FIG. 21. In the location shown in FIG. 21, heat transfer from heat spreading layer 92 may be increased beyond the heat transfer in FIG. 20, because heat spreading layer 92 is in contact with midplate 122 over a larger area in FIG. 21 than in FIG. 20. Due to the increased heat transfer between layer 92' and midplate 122, the rate at which layer 92' is raised in temperature due to heating from the heat generating components may be slowed, preventing further, potentially excessive, expansion of layer 92'.

If desired, the expansion of layer 92' in the examples of FIGS. 19, 20, and 21 may be temporary. Initially, when layer 92' is unheated, layer 92' will have a shape of the type shown in FIG. 19. Following heating, layer 92' may take on the form shown in FIGS. 20 and 21. Upon cooling, layer 92' will contract back to the original shape shown in FIG. 19.

The expansion of layer 92' may also be permanent. During initial display assembly operations, layer 92' and structure 124 may be assembled into device housing 12. When display 14 is used for the first time or when other heat-producing component is used for the first time, the heat will cause layer 92' to expand (e.g., into the shape shown in FIG. 20 or 21). Material in layer 92' (e.g., polymer support layers, etc.) may remain expanded following heating. This type of approach may allow air gaps such as air gap H to be present during initial assembly operations so that display backlight unit 42, heat spreading layer 92, and other structures can be properly assembled within device housing 12. After assembly, the presence of persistent air gaps could have the potential to hinder heat dissipation. The use of permanently deformed heat spreading layers such as layer 92' of FIG. 20 or FIG. 21 may therefore help enhance heat dissipation.

Figure 22:
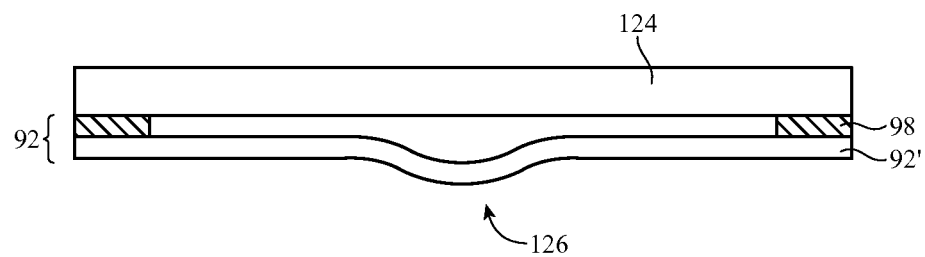
FIG. 22 is a cross-sectional side view of an illustrative flexible structure to which a heat spreading layer has been attached with adhesive in a configuration that leaves a portion of the heat spreading layer unbonded to the flexible structure to accommodate bending of the flexible structure in accordance with an embodiment.
Figure 23:
FIG. 23 is a cross-sectional side view of the illustrative structure of FIG. 22 following bending of the middle of the structure in a downward direction in accordance with an embodiment.
Figure 24:
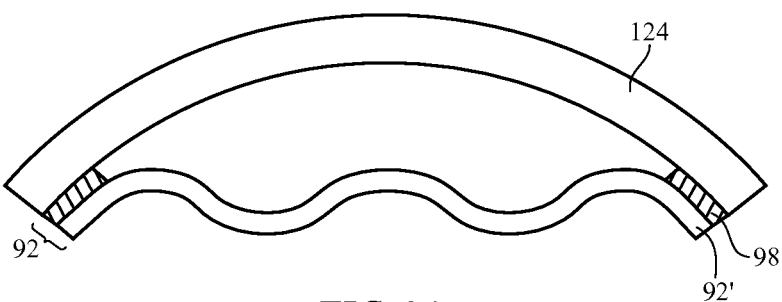
FIG. 24 is a cross-sectional side view of the illustrative structure of FIG. 23 following bending of the middle of the structure in an upward direction in accordance with an embodiment.

FIGS. 22, 23, and 24 show how heat spreading layer may be attached to a flexible structure such as flexible structure 124. Structure 124 may be a display (e.g., a flexible organic light-emitting diode display), may be a flexible printed circuit, or other flexible structure in device 10. Heat generating components in structure 124 (e.g., diodes and other circuitry in an organic light-emitting diode display or integrated circuits, light-emitting diodes on a flexible printed circuit, other components on a flexible printed circuit, or other heat generating components) may generate heat. Heat spreading layer 92 may spread the heat that is generated. Heat spreading layer 92 may have heat spreading material layer 92' (e.g., a layer of graphite, copper, and/or other material with optional plastic carrier layers). Adhesive 98 in heat spreading layer 92 may be used to attach heat spreading layer to flexible structure 124. Adhesive 98 may be located at the edges of structure 124 or may be patterned in other shapes that create unbonded areas (e.g., thin air gaps or other areas not directly attached by adhesive) between heat spreading layer 92 and flexible structure 124 (see, e.g., the adhesive configurations of FIGS. 13, 14, 15, 16, 17, and 18). If desired, layer 92 may be provided with excess material and may be attached to flexible structure 124 so that a wrinkle is present such as wrinkle 126. When flexible structure 124 is bent so that the center of structure 124 moves downwards with respect to the opposing edges of structure 124, layer 92' may be pulled taut and wrinkle 126 may expand to allow heat spreading layer 92 to bend with flexible structure 124. When flexible structure 124 is bent in the opposite direction so that the center of structure 124 moves upwards with respect to the edges of structure 124, layer 92' can move away from structure 124 and form wrinkles, as shown in FIG. 24. If the center of layer 92 were to be attached to the center of flexible structure 124, the formation of wrinkles in layer 92 might wrinkle structure 124. The use of adhesive 98 in a pattern that allows the unbonded center of heat spreading layer 92 to move relative to flexible structure 124 therefore prevents wrinkles from being formed. The configuration of FIGS. 22, 23, and 24 may be used to allow the use of a heat spreading layer on a flexible display, on the underside of a flexible printed circuit, or other flexible component for device 10.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   display layers including a layer of liquid crystal material;
   backlight structures that supply backlight that passes through the display layers; and
   a heat spreading layer that is attached to the backlight structures, wherein the heat spreading layer includes patterned adhesive that attaches first portions of the heat spreading layer to the backlight structures and that does not attach second portions of the heat spreading layer to the backlight structures, wherein the heat spreading layer is positioned in a first position at a first temperature and a second position at a second temperature, wherein in the first position the first and second portions of the heat spreading layer are separated from a metal midplate by an air gap, wherein in the second position the first portions of the heat spreading layer are separated from the metal midplate by the air gap and the second portions of the heat spreading layer directly contact the metal midplate, and wherein the second temperature is greater than the first temperature.

2. The display defined in claim 1 wherein the heat spreading layer comprises a layer of graphite.

3. The display defined in claim 1 wherein the heat spreading layer comprises a layer of copper.

4. The display defined in claim 1 wherein the backlight structures include a light guide plate and a reflector and wherein the patterned adhesive attaches the heat spreading layer to the backlight structures so that the reflector is interposed between the heat spreading layer and the light guide plate.

5. The display defined in claim 4 further comprising:
   light-emitting diodes that supply light to the light guide plate; and
   a flexible printed circuit on which the light-emitting diodes are mounted.

6. The display defined in claim 5 further comprising light blocking tape that is attached to the flexible printed circuit and the reflector.

7. The display defined in claim 6 wherein the light blocking tape is interposed between the heat spreading structures and the flexible printed circuit.

8. The display defined in claim 7 wherein the patterned adhesive includes patterned adhesive selected from the group consisting of: a C-shape strip of adhesive, an array of adhesive patches, a cross-shaped region of adhesive, and parallel strips of adhesive.

9. An electronic device, comprising:
   a housing that includes a metal midplate member;
   display layers including a layer of liquid crystal material;
   backlight structures that supply backlight that passes through the display layers; and
   a flexible heat spreading layer that is attached to the backlight structures, wherein at first temperature the entire flexible heat spreading layer is separated from the metal midplate member by an air gap, wherein at a second temperature at least a portion of the flexible heat spreading layer expands across the air gap to contact the metal midplate member, wherein the second temperature is greater than the first temperature, and wherein the flexible heat spreading layer is heated from the first temperature to the second temperature by heat generated by the backlight structures.

10. The electronic device defined in claim 9 wherein the heat spreading layer comprises:
    at least one polymer layer;
    a layer of graphite on the polymer layer;
    adhesive that attaches the heat spreading layer to the backlight structures.

11. The electronic device defined in claim 10 wherein the backlight structures comprise:
    light-emitting diodes on a flexible printed circuit; and
    a reflector.

12. The electronic device defined in claim 11 wherein the adhesive forms a strip that runs along at least one edge of the backlight structures and creates an unbonded area between the heat spreading layer and the backlight structures.

13. The electronic device defined in claim 12 wherein the backlight structures comprise a chassis, wherein the backlight structures include a light guide plate that receives light from the light-emitting diodes, wherein the light guide plate and the reflector are mounted in the chassis, and wherein at least some of the adhesive is attached to the chassis.

14. An apparatus, comprising:
    a flexible structure that is supplied with heat in an electronic device, wherein the flexible structure is a flexible structure selected from the group consisting of: an organic light-emitting diode display and a flexible printed circuit in a backlight unit; and
    a flexible heat spreading layer having adhesive that is patterned to attach the flexible heat spreading layer to the flexible structure so that there is at least one unbonded region of the flexible heat spreading layer that is free of adhesive, wherein the unbonded region is interposed between first and second regions of the flexible heat spreading layer that are attached to the flexible structure with the adhesive, wherein at a first temperature the entire flexible heat spreading layer is separated from a metal structure by and air gap, wherein at a second temperature at least a portion of the unbonded region of the flexible heat spreading layer extends across the air gap to directly contact the metal structure, and wherein the second temperature is greater than the first temperature.

15. The apparatus defined in claim 14 wherein the flexible structure comprises the organic light-emitting diode display.

16. The apparatus defined in claim 15 wherein the flexible heat spreading layer includes a layer of graphite.

17. The apparatus defined in claim 14 wherein the flexible structure comprises the flexible printed circuit in the backlight unit, wherein the backlight unit includes light-emitting diodes on the flexible printed circuit, a light guide plate, and a reflector, and wherein the apparatus further comprises light-blocking tape attached to the flexible printed circuit and the reflector.

18. The apparatus defined in claim 14 wherein the metal structure is a stainless steel plate.

19. The apparatus defined in claim 14, wherein the flexible heat spreading layer is parallel to the metal structure at the first temperature.

20. The apparatus defined in claim 14, wherein the heat spreading layer has at least one bend at the second temperature.

* * * * *